United States Patent
Rostek et al.

(10) Patent No.: US 8,247,679 B2
(45) Date of Patent: Aug. 21, 2012

(54) APPARATUS FOR GENERATING ELECTRICAL POWER FROM THE WASTE HEAT OF AN INTERNAL COMBUSTION ENGINE

(75) Inventors: Wilfried Rostek, Paderborn (DE); Torsten Howe, Bünde (DE); Thorsten Andres, Paderborn (DE); Björn Richter, Paderborn (DE); Mathilde Kny, Paderborn (DE)

(73) Assignee: Benteler Automobiltechnik GmbH, Paderborn (DE)

( * ) Notice: Subject to any disclaimer, the term of this patent is extended or adjusted under 35 U.S.C. 154(b) by 386 days.

(21) Appl. No.: 12/437,455

(22) Filed: May 7, 2009

(65) Prior Publication Data

US 2009/0283126 A1 Nov. 19, 2009

(30) Foreign Application Priority Data

May 8, 2008 (DE) .......................... 10 2008 022 802

(51) Int. Cl.
*H01L 35/30* (2006.01)
*H01L 35/32* (2006.01)

(52) U.S. Cl. ......... 136/209; 136/208; 136/210; 136/216

(58) Field of Classification Search .................. 136/203, 136/205, 208, 209, 223; 62/3.2, 3.3
See application file for complete search history.

(56) References Cited

U.S. PATENT DOCUMENTS

| 3,329,532 | A | * | 7/1967 | Austin et al. | 136/202 |
| 3,413,156 | A | * | 11/1968 | Campana | 136/212 |
| 5,419,780 | A | * | 5/1995 | Suski | 136/205 |
| 6,073,449 | A | * | 6/2000 | Watanabe et al. | 62/3.2 |
| 6,096,966 | A | * | 8/2000 | Nishimoto et al. | 136/208 |
| 6,986,247 | B1 | * | 1/2006 | Parise | 136/205 |
| 2005/0217714 | A1 | * | 10/2005 | Nishijima et al. | 136/208 |
| 2006/0243317 | A1 | * | 11/2006 | Venkatasubramanian | 136/206 |

FOREIGN PATENT DOCUMENTS

| DE | 10 2006 039 024 A1 | 2/2008 |
| EP | 1 500 808 A1 | 1/2005 |

* cited by examiner

*Primary Examiner* — Basia Ridley
*Assistant Examiner* — Andrew Golden
(74) *Attorney, Agent, or Firm* — Barnes & Thornburg LLP

(57) ABSTRACT

An apparatus for generating electrical power from the waste heat generated by an internal combustion engine includes a first pipe wall through which a heated medium flows, a thermoelectric generator disposed exteriorly to the inner pipe wall, and a second pipe wall disposed exteriorly to the thermoelectric generator. The first pipe wall and the second pipe wall form at least a partially double-walled pipe. The first pipe wall saves as a high-temperature source. The second pipe wall serves as a low-temperature source.

16 Claims, 1 Drawing Sheet

APPARATUS FOR GENERATING ELECTRICAL POWER FROM THE WASTE HEAT OF AN INTERNAL COMBUSTION ENGINE

CROSS-REFERENCE TO RELATED APPLICATION(S)

This United States Non-Provisional Patent Application relies for priority on German Patent Application No. DE 10 2008 022 802.8, filed on May 8, 2008, the contents of which are incorporated herein by reference.

FIELD OF THE INVENTION

The invention relates to an apparatus for generating electrical power from the waste-heat of a motor-vehicle internal combustion engine.

DESCRIPTION OF RELATED ART

It is known that approximately a third of the supplied fuel energy of an internal combustion engine merges directly with the exhaust gas in the form of thermal energy. This thermal energy, which has not been employed to date, is to be converted into electrical energy with the aid of thermoelectric generators. In this way, the generator driven by the engine is relieved of load, as a result of which fuel can be saved.

The prior art discloses various apparatuses and methods for generating electrical power from the waste heat of an internal combustion engine. The thermoelectric generators used here convert a prevailing temperature difference directly into electrical energy using the Seebeck effect. In this case, the existing temperature difference is proportional to the generated electric potential. The thermoelectric generators comprise individual thermal elements which preferably form a pair of p- and n-doped semiconductor materials.

Various approaches to using thermoelectric generators for generating power in the field of motor vehicles are known. EP1500808A1 discloses a method and a system for controlling the exhaust-gas temperature of an internal combustion engine, with the thermoelectric generator being arranged upstream of the catalytic converter in the engine exhaust line. The thermoelectric generator can be used both as a heat pump for increasing the exhaust-gas temperature in the catalytic converter and also as a generator for generating energy, depending on the exhaust-gas temperature.

One disadvantage is that this may lead to changes in the dynamic conditions in the exhaust-gas line. At the same time, soiling of the surfaces of the thermoelectric generator, for example by soot particles being deposited, can be expected. The result is a reduction in the introduction of heat and therefore a reduction in electrical power as the degree of soiling increases.

DE102006039024A1 describes thermoelectric generators which are designed as ring elements and surround the outside of the exhaust pipe of an exhaust system. The thermoelectric generators are surrounded by a housing which is cooled from the outside. In order to incorporate a generator of this type in a motor vehicle, a cooling apparatus has to be installed on the thermoelectric generators, as a result of which costs are increased.

SUMMARY OF THE INVENTION

The object of the present invention is to provide an apparatus for generating electrical power from the waste heat of a motor-vehicle internal combustion engine, which apparatus can be integrated in a motor vehicle in a cost-effective manner and is not susceptible to soiling.

This object is achieved by an apparatus for generating electrical power from the waste heat of a motor-vehicle internal combustion engine.

On account of the thermoelectric generator being arranged in an air gap between a first inner pipe wall or a first inner pipe and a second outer pipe wall or a second outer pipe of a double-walled pipe which conducts waste heat, no separate high-temperature source or low-temperature source needs to be introduced to the thermoelectric generator. The thermoelectric generator only has to be inserted into the air gap.

The generated voltage can be used to feed, for example, electrical energy to the on-board power supply system of a vehicle. A plurality of individual thermal elements can be connected in series or in parallel, depending on the required impedance of the electrical device which is to be supplied with power.

Further advantageous developments of the invention are identified in the discussion that follows.

By virtue of the pipe being in the form of an exhaust pipe, a component which is already contained in the motor vehicle is used. A temperature gradient which is suitable for generating power using the thermoelectric generator is available in the double-walled exhaust pipe.

Heat exchange between the inner pipe wall and the thermoelectric generator via an interposed air gap ensures sufficient heat transfer and, with this design, it is also possible to use thermal generators in the high-temperature range of an exhaust manifold, without said thermal generator having to be designed for this temperature range. At the same time, this affords the advantage that the thermoelectric generator does not have to be firmly connected on its high-temperature side. The different expansions in length of the thermal generator components caused on account of unequal coefficients of expansion can be easily compensated for in this way.

The arrangement of a black absorption layer on that side of the thermoelectric generator which faces the first pipe wall additionally intensifies the thermal radiation absorption of the thermoelectric generator.

Optimum heat transfer is ensured on account of the direct contact between the thermoelectric generator and the inner pipe wall in an alternative embodiment, with the result that this embodiment is particularly suitable for the use of thermal generators which are designed for the high-temperature range (>400° C.). The advantage of this embodiment is that the introduction of heat is improved and, at the same time, a higher usable temperature difference is available compared to the use of thermal radiation in other embodiments.

Connection of the thermoelectric generator to an electronic control system permits easy-to-manage use of the thermoelectric generator for other purposes, for example to control the temperature of the exhaust-gas stream conducted through the apparatus according to the invention.

BRIEF DESCRIPTION OF THE DRAWINGS

Exemplary embodiments are described below with reference to the appended drawings, in which.

DETAILED DESCRIPTION OF EMBODIMENT(S) OF THE INVENTION

Figure 1:
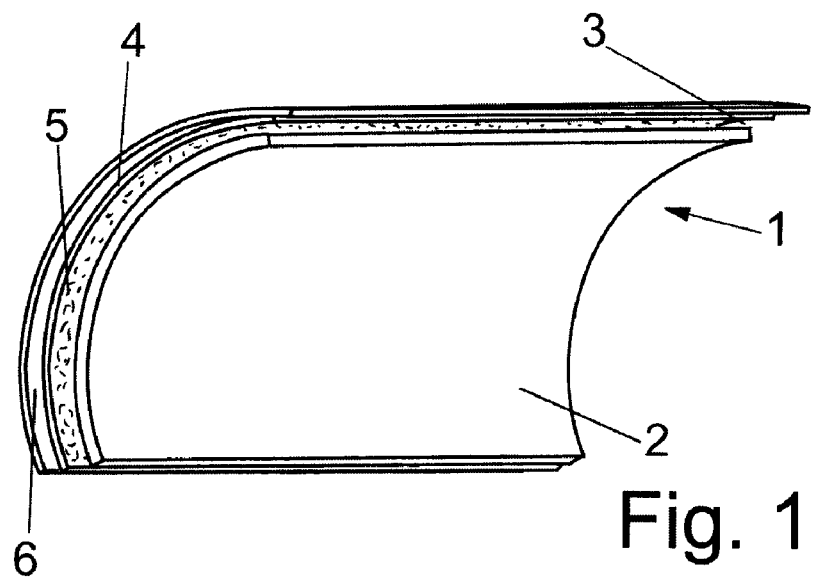
FIG. 1 shows a perspective schematic side view of an exemplary embodiment of an apparatus according to the invention.

In the discussion that follows, reference is made to one or more embodiments shown in the drawings. The invention, however, is not intended to be limited to the embodiments shown and described. To the contrary, the invention is intended to encompass additional equivalents and variations, as should be understood by those skilled in the art.

In the following description of the figures, terms such as above, below, to the left, to the right, in front, behind etc. refer only to the exemplary illustrations and position of the apparatus and its constituent parts selected in the respective figures. These terms are not to be understood as restrictive, that is to say these relationships can change in different operating positions or by virtue of mirror-image symmetrical design or the like.

FIG. 1 shows a preferred embodiment of the apparatus for generating electrical power from the waste heat of a motor-vehicle internal combustion engine. The apparatus has a double-walled pipe 1 with a first inner pipe wall 2 and a second outer pipe wall 6 and also a thermoelectric generator 4 which is arranged in an air gap 3 between the first inner pipe wall 2 and the second outer pipe wall 6. During operation of the motor-vehicle internal combustion engine, a medium which transports waste heat flows through the pipe 1. For the purpose of generating power, the first inner pipe wall 2 serves the thermoelectric generator 4 as a high-temperature source and the second outer pipe wall 6 as a low-temperature source. It is also feasible for only a portion of the pipe 1 to be of double-walled design, with the thermoelectric generator 4 being arranged in the double-walled region of the pipe, as described above.

The pipe 1 is preferably an exhaust pipe and the medium which transports waste heat is preferably an exhaust gas from the motor-vehicle internal combustion engine. The pipe 1 is particularly preferably a component piece of the exhaust system of a motor vehicle between an exhaust manifold and a catalytic converter, in which component piece the exhaust gas from the exhaust manifold is passed to the catalytic converter during operation of the motor-vehicle internal combustion engine.

The task of the air gap 3 between the pipe walls 2, 6 of the double-walled pipe is to insulate the inner pipe, as a result of which heat exchange between the exhaust gas and the external air, and therefore cooling of the exhaust gas, is reduced. In this way, an operating temperature which is required for the catalytic converter can be reached as quickly as possible, in particular during the cold-start phase.

The second outer pipe wall 6 can be cooled by a cooling medium on that side which is averted from the first pipe wall 2, in particular by the ambient air. Cooling using another medium, for example water, is likewise feasible.

Figure 2:
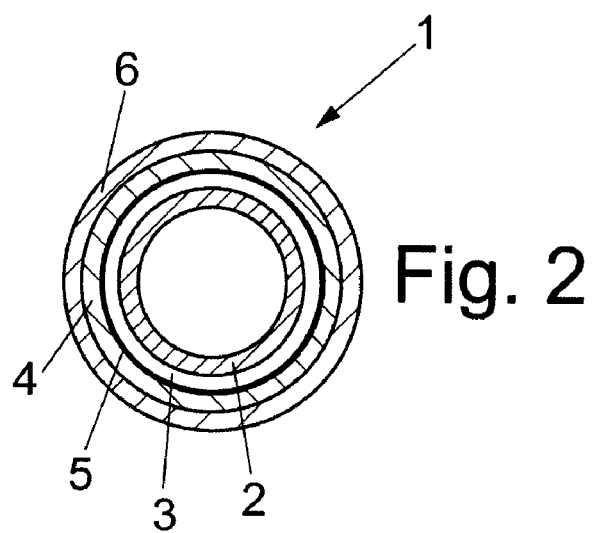
FIG. 2 shows a schematic plan view of an exemplary embodiment of an apparatus according to the invention.

In the plan view shown in FIG. 2, the thermoelectric generator 4 is fixed only to the second outer pipe wall 6. In this embodiment, heat is transferred between the first pipe wall 2 and the thermoelectric generator 4 mainly by thermal radiation, whereas heat is transferred between the second pipe wall 6 and the thermoelectric generator 4 by thermal conduction. One advantage of this embodiment is that the thermoelectric generator 4 is not firmly connected to the high temperature side, that is to say to the inner pipe 2. The different expansions in length of the components of the thermal generator 4 caused on account of unequal coefficients of expansion can be easily compensated for in this way. A further advantage is that thermal generators can also be used in the high-temperature range of an exhaust manifold, without the said thermal generators having to be designed for this temperature range.

In order to intensify the absorption of the thermal radiation emanating from the inner pipe 2, that side of the thermoelectric generator 4 which faces the first pipe wall 2 can be provided with a, for example, black absorption layer.

Figure 3:
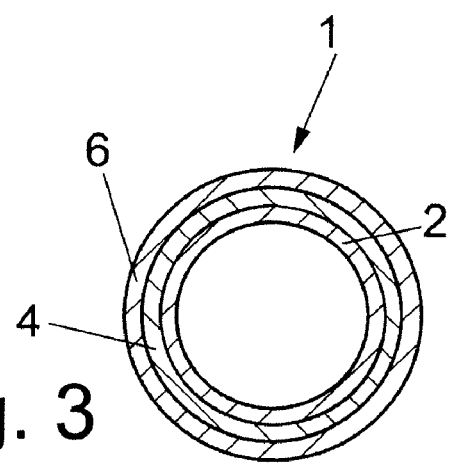
FIG. 3 shows a schematic plan view of a further exemplary embodiment of an apparatus according to the invention.

In the plan view of another embodiment shown in FIG. 3, the thermoelectric generator 4 is fixed to the first pipe wall 2 and the second pipe wall 6. In this embodiment, heat is transferred between the first pipe wall 2 and the thermoelectric generator 4 and between the second pipe wall 6 and the thermoelectric generator 4 by heat conduction. This embodiment is suitable for the use of thermal generators which are designed for the high-temperature range (>400° C.). The advantage of this embodiment is that the introduction of heat is improved and, at the same time, a higher usable temperature difference is available compared to the use of thermal radiation in the first embodiment.

In addition to the primary function of providing electrical energy, three further functions can be realized by the apparatus, it being possible to electrically adjust these functions using a corresponding logic system. To this end, the thermoelectric generator 4 is preferably coupled to an electronic control system.

With the aid of the electronic control system, the apparatus is suitable for feeding the electrical power, which is generated by the thermoelectric generator 4, to a battery or an on-board power supply system of the motor vehicle, preferably via an intermediate electric circuit.

In addition to generating electrical energy, the thermoelectric generator 4 can alternatively be used for temperature control which can be realized by virtue of a corresponding electrical circuit, for example with power resistors. This controllable cooling function is critical particularly during full-load operation, so that overheating of the catalytic converter can be counteracted in a targeted manner.

The thermoelectric generator can be actively used as a heat source or as a cooling unit in the apparatus by utilizing the Peltier effect. In this case, the application of an electric current produces a heat flow which heats or cools the first inner pipe wall 2. Active temperature control can also be realized in this way. Corresponding switchover to this mode is the task of the intermediate circuit or the electronic control system, triggered by an external control signal for example.

The electronic control system is further suitable for interrupting an electrical connection between an electrical load, which is coupled to the electronic control system, and the thermoelectric generator 4 as a function of the temperature of the exhaust gas which flows through the exhaust pipe 1.

At an excessively low exhaust-gas temperature, no more current flows through the thermoelectric generator 4. Therefore, energy is also no longer converted, as a result of which less heat is drawn from the inner pipe 2. Corresponding switchover to this mode is the task of the intermediate circuit. The electronic control system is preferably coupled to a temperature sensor for the purpose of measuring the exhaust-gas temperature. As an alternative, the temperature can also be reconstructed from the generator voltage.

During operation, a high-temperature source is initially generated on that side of the thermoelectric generator 4 which faces the first pipe wall 2 by conducting the medium which stores waste heat through the pipe 1 in order to generate electrical power from the waste heat of a motor-vehicle internal combustion engine having an above-described apparatus. In this case, some of the heat is transferred to the material of the first pipe wall 2 and the first pipe wall 2 is heated in the process. The low-temperature source is generated on that side of the thermoelectric generator 4 which faces the second pipe wall 6 by cooling that side of the second pipe wall 6 which is averted from the thermoelectric generator 4 using a cooling medium, in particular the ambient air. Using the temperature gradients generated as a result, the waste heat which is transmitted to the first pipe wall 2 is converted into electrical power by the thermoelectric generator 4.

In addition, the temperature of the exhaust gas of a motor-vehicle internal combustion engine can be actively controlled with an above-described apparatus having an electronic control system. In this case, the exhaust gas is first conducted through the pipe 1. This heats the first pipe wall 2. If the thermoelectric generator 4 is now supplied with power in such a way that heat is conducted away from that side of the thermoelectric generator 4 which faces the first pipe wall 2, the thermoelectric generator 4 serves to additionally cool the exhaust-gas stream in this manner of operation. If the thermoelectric generator 4 is supplied with power in such a way that heat is passed to that side of the thermoelectric generator 4 which faces the first pipe wall 2, the thermoelectric generator 4 serves to heat the exhaust-gas stream in this manner of operation, and this is useful, in particular, in the warm-up phase of the motor-vehicle engine.

The invention claimed is:

1. An apparatus for generating electrical power from the waste heat generated by an internal combustion engine, comprising:
   a first pipe wall through which a heated medium flows;
   a thermoelectric generator disposed exteriorly to the first pipe wall; and
   a second pipe wall disposed exteriorly to the thermoelectric generator,
   wherein the first pipe wall and the second pipe wall form at least a partially double-walled pipe,
   wherein the first pipe wall serves as a high-temperature source,
   wherein the second pipe wall serves as a low-temperature source; and
   wherein the thermoelectric generator is in direct contact only with the second pipe wall and heat is transferred between the first pipe wall and the thermoelectric generator by thermal radiation and convection via an air gap located between the first pipe wall and the thermoelectric generator.

2. The apparatus as claimed in claim 1, wherein the pipe is an exhaust pipe.

3. The apparatus as claimed in claim 1, wherein the heated medium is an exhaust gas from the internal combustion engine.

4. The apparatus as claimed in claim 1, wherein the thermoelectric device is located in the pipe, which pipe is a component piece of an exhaust system of a motor vehicle between an exhaust manifold and a catalytic converter.

5. The apparatus as claimed in claim 1, wherein the second pipe wall is cooled by a cooling medium.

6. The apparatus as claimed in claim 5, wherein the cooling medium is air.

7. The apparatus as claimed in claim 1, wherein a side of the thermoelectric generator facing the first pipe wall is provided with a black absorption layer for intensifying the absorption of the thermal radiation emanating from the first pipe wall.

8. The apparatus as claimed in claim 1, wherein the thermoelectric generator is coupled to an electronic control system.

9. The apparatus as claimed in claim 8, wherein the electronic control system has an intermediate electric circuit for impedance matching.

10. The apparatus as claimed in claim 8, wherein the electronic control system is suitable for feeding the electrical power generated by the thermoelectric generator to at least one of a battery and an onboard power supply system of the motor vehicle.

11. The apparatus as claimed in claim 8, wherein the electronic control system is suitable for supplying power to the thermoelectric generator to cool the first pipe wall.

12. The apparatus as claimed in claim 8, wherein the electronic control system is suitable for supplying power to the thermoelectric generator to heat the first pipe wall.

13. The apparatus as claimed in claim 8, wherein the electronic control system is suitable for interrupting an electrical connection between an electrical load, which is coupled to the electronic control system, and the thermoelectric generator as a function of the temperature of the heated medium to reduce a cooling capacity of the thermoelectric generator.

14. The apparatus as claimed in claim 13, wherein the electronic control system is coupled to a temperature sensor for the purpose of measuring a temperature of the heated medium.

15. The apparatus as claimed in claim 13, wherein the electronic control system reconstructs a temperature of the heated medium from the voltage generated by the thermoelectric generator.

16. The apparatus as claimed in claim 1, wherein the internal combustion engine is associated with a motor vehicle.

* * * * *